United States Patent [19]

Thompson

[11] Patent Number: 4,740,823
[45] Date of Patent: Apr. 26, 1988

[54] PHOTO-DETECTORS

[75] Inventor: George H. B. Thompson, Sawbridgeworth, Great Britain

[73] Assignee: ITT Gallium Arsenide Technology Center, a Division of ITT Corporation, Roanoke, Va.

[21] Appl. No.: 791,197

[22] Filed: Oct. 25, 1985

[30] Foreign Application Priority Data

Oct. 26, 1984 [GB] United Kingdom ............... 8427179

[51] Int. Cl.⁴ ........................................... H01L 27/14
[52] U.S. Cl. ...................................... 357/30; 357/41; 357/22
[58] Field of Search ................. 357/22 A, 22 B, 30 E, 357/30 G, 30 I, 30 B, 41

[56] References Cited

U.S. PATENT DOCUMENTS 4,424,525  1/1984  Mimura ........................... 357/22 A
4,598,305  7/1986  Chiang et al. ...................... 357/30 I Primary Examiner—Martin H. Edlow
Attorney, Agent, or Firm—Robert A. Walsh; Thomas N. Twomey; Mary C. Werner

[57] ABSTRACT

A photo-detector includes a photoconductor comprised by a structure similar to a high electron mobility transistor (HEMT) but with the gate removed and the layer of high band gap thinned in order to reduce noise. On a semi-insulating substrate (8), an n-channel layer (9) is disposed and on channel layer (9) is disposed on n+ layer (7). Light incident on the n+ layer (7) causes electron-hole pairs to be generated in layer 9, the electrons and holes of which migrate to oppositely biased contact regions 10 and 11 respectively. The photoconductor is monolithically integrated with an HEMT (TI) (FIG. 3, FIG. 4 or FIG. 6) the latter comprising a pre-amplifier for a receiver circuit. In dependence on the materials chosen the photo-detector may be employed to detect wavelengths of the order of <8.88 μm or <1.6 μm.

8 Claims, 2 Drawing Sheets

PHOTO-DETECTORS

BACKGROUND OF THE INVENTION

This invention relates to photo-detectors and in particular, but not exclusively, to monolithically integrable photo-detectors for use as optical communications receivers.

SUMMARY OF THE INVENTION

According to the present invention there is provided a photo-detector comprising a photoconductor monolithically integrated with a high electron mobility transistor (HEMT) on a common semi-insulating substrate, wherein the photoconductor comprises a first layer of one conductivity type disposed on said semi-insulating substrate and comprising a channel layer, a second layer of the one conductivity type but a higher bandgap than the first layer being disposed on the first layer, and first and second spaced means contacting the channel layer, wherein in use one of said first and second contacting means is biased more positively than the other and when light is incident upon said second layer electron-hole pairs are generated in the channel layer, the electrons of which pairs migrate to the more positively biased contacting means and the holes of which migrate to the other contacting means, wherein the HEMT includes layers corresponding to said first and second layers and of the same materials as the photoconductor, the second layer of the photoconductor being thinner than the second layer of the HEMT, whereby to reduce noise, and wherein the gate of the HEMT is connected to one of the first and second contacting means and is biased negative, or positive, in use via a bias resistor, the other of said first and second contacting means being biased in use with opposite polarity.

DESCRIPTION OF THE PREFERRED EMBODIMENTS

Figure 1:
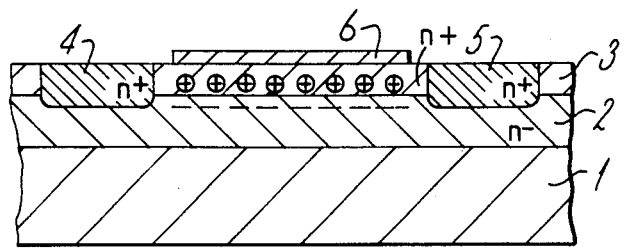
FIG. 1 shows a cross-section through a high electron mobility transistor (HEMT)
Figure 5A:
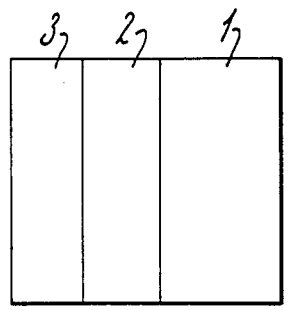
FIGS. 5a, 5b and 5c illustrate the energy band structure for three different layer structures.
Figure 5A:
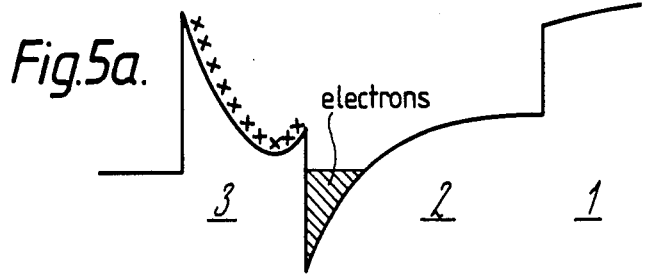

A high electron mobility transistor (HEMT) as illustrated in FIG. 1 comprises a semi-insulating substrate 1, a very low doped n-type channel layer 2, an n-type higher band gap layer 3 with ideally a thin undoped region adjacent to the channel layer, alloyed or n+ implanted source and drain regions 4 and 5 and a gate 6. The corresponding energy band structure is shown in FIG. 5a.

Figure 2:
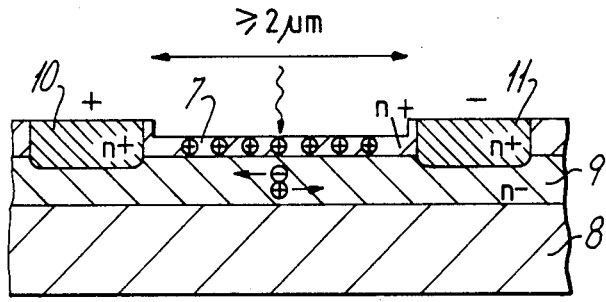
FIG. 2 shows a cross-section through a photoconductor for a photo-detector.

A photoconductor of a photo-detector of the present invention is illustrated in FIG. 2. It is based on the HEMT structure of FIG. 1, the gate being omitted and a portion 7 of the higher bandgap layer corresponding to layer 3 being thinner than the remainder, in order to reduce the sheet conductivity induced in layer 9 and hence the noise. The photoconductor of FIG. 2 thus comprises a semi-insulating substrate 8, an n-type channel layer 9, the n-type higher bandgap layer 7 and alloyed or n+ implanted regions 10 and 11. When light is incident on layer 7 photon-induced electron-hole pairs are generated in the channel layer 9, the holes of which drift towards the diffused region which is negatively biased (region 11) and the electrons of which drift towards the diffused region which is positively biased (region 10). The width of the layer portion 7 (equivalent to the channel width of the HEMT) is typically $\geq 2$ $\mu$m.

Figure 3:
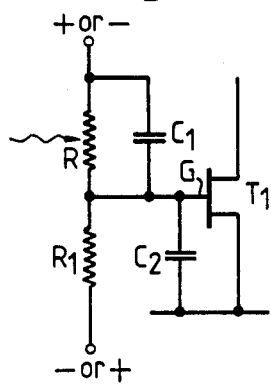
FIG. 3 shows the equivalent circuit diagram of a photo-detector of the present invention.

The photoconductor of FIG. 2 may be employed in a receiver circuit (photo-detector) with an amplifier as illustrated in FIG. 3, the photoconductor comprising the resistance R and capacitance C1. The value of R is required to be as high as possible and the value of C1 as low as possible for optimum performance, the mean square noise current being equal to $(4kTB)/R$ where k=Boltzmanns constant, T=absolute temperature and B=bandwidth.

The circuit further includes a bias resistor R1 and a FET transistor T1 to whose gate G is applied the output of the photoconductor which serves to cause the FET to either increase or decrease its conductivity depending on the bias polarity when light is incident on the photoconductor, and in practice capacitance C2 which also should be as low as possible.

The photoconductor, the FET and the bias resistor R1 may be readily monolithically integrated, the FET being comprised by an HEMT. During fabrication of such an integrated structure the layer providing the layer portion 7 of the photoconductor and the layer 3 of the HEMT will need to be locally thinned in the region of the photoconductor. This may be achieved by chemical or plasma etching.

Figure 4:
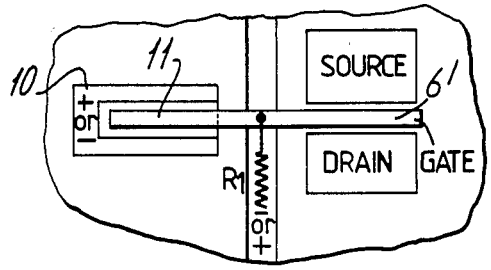
FIG. 4 shows a schematic plan view of an embodiment of photo-detector of the present invention.

FIG. 4 shows a plan view of a photo-detector comprising an integrated photoconductor and HEMT. The photoconductor and HEMT are formed in respective areas of a wafer and electrically isolated from one another, apart from the extended gate 6[1] which contacts region 11 of FIG. 2, such as by being formed in respective mesas arranged on the semi-insulating substrate 1,8. The bias resistor R1 may be formed by, for example, thick film techniques, on exposed portions of the semi-insulating substrate together with any necessary electrical interconnections or contacts.

Figure 5B:
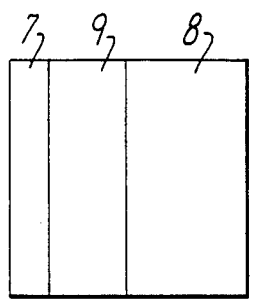
Figure 5B:
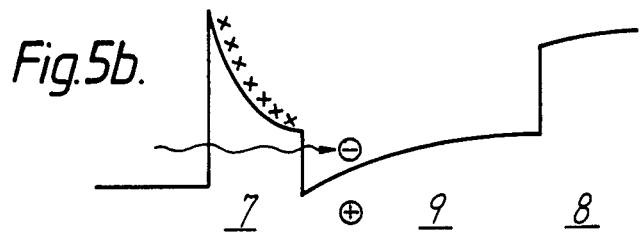
Figure 5C:
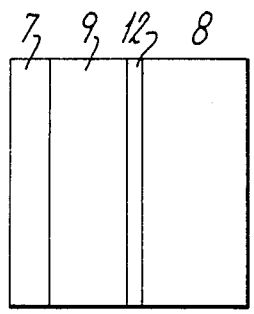
Figure 5C:
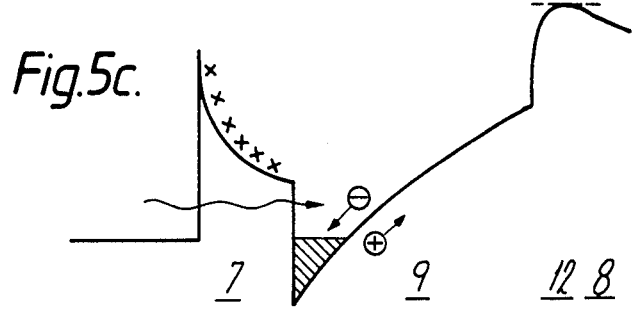

The energy band structure for the photoconductor is shown in FIG. 5b. The effect of reducing the thickness of the higher bandgap layer relative to that of the HEMT (FIG. 5a) can be clearly seen. To ensure the presence of a sufficient field across the channel for the separation of the photo-generated electrons and holes a thin p-doped higher bandgap layer 12 (FIG. 5c) may be grown between the channel layer 9 and the semi-insulating substrate of FIG. 5b of tipping the channel layer portion as indicated in FIG. 5c with resultant drifting of electrons down the slope towards the junction between the channel 9 and the higher bandgap layer 7 and corresponding drifting of holes up the slope.

For use as a detector of light of wavelengths less than 1.6 um the device may be formed in a structure comprising a semi-insulating InP substrate, with an n⁻ GaInAs channel layer and an N+InP or AlInAs higher bandgap layer. The thin p-doped higher bandgap layer could in this case be InP. In the case of use for detection of light of a wavelength less than 0.88 $\mu$m the n-doped higher band gap layer may be of AlGaAs, the channel layer of GaAs and the optical p-doped higher band gap of p-doped AlGaAs, with a semi-insulating GaAs substrate.

Figure 6:
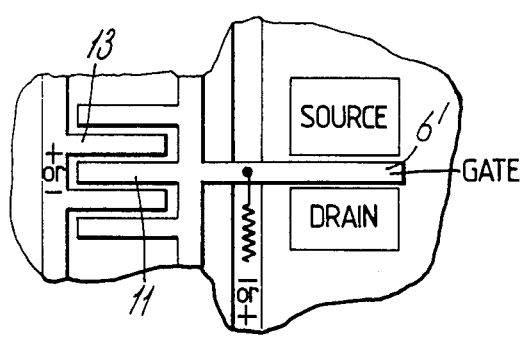
FIG. 6 shows a plan view of an alternative embodiment of photo-detector according to the present invention.

In order to improve performance the effective area of the photoconductor upon which light is incident may be increased in comparison with FIG. 4 and a more interdigitated electrode structure 13 employed, as illustrated schematically in FIG. 6, for example. Other elements in FIG. 6 which have the same function as elements in FIG. 4 have the same reference numerals.

I claim:

1. A photo-detector comprising:
   a substrate of a semi-insulating material;
   a high electron mobility transistor monolithically located on said substrate;
   a photoconductor located on said substrate and monolithically integrated with said transistor, said photoconductor including
      a first layer of a semiconductor material of one conductivity type disposed on said substrate forming a channel layer,
      a second layer disposed on said first layer of a semiconductor material of the one conductivity type and of a higher bandgap than said first layer,
      a first implanted region located on said first layer,
      a second implanted region located on said fist layer and spaced from said first means;
   said second layer having one section of reduced thickness, said section being located intermediate said first and second implanted regions,
   said first layer being responsive to light incident on said second layer for generating electron-hole pairs, the holes drifting to said first implanted region which is positively biased and the electrons drifting to said second implanted region which is negatively biased, the conductivity induced in said first layer being reduced by said reduced thickness second layer in order to reduce noise.

2. The photo-detector of claim 1 wherein said high electron mobility transistor includes
   a first layer of a semiconductor material of one conductivity type disposed on said substrate forming a channel layer;
   a second layer disposed on said first layer of a semiconductor material of the one conductivity type and of a higher bandgap than said first layer, said second layer of said transistor being of a greater thickness than said second layer of said photoconductor;
   a gate connected to one of said first or second implanted regions of said photoconductor; and
   a bias resistor connected to said gate and operative to bias said connected gate in either one of a positive or negative state, the other of said implanted regions being oppositely biased.

3. A photo-detector as claimed in claim 1, wherein the photoconductor includes a layer of opposite conductivity type and high band gap disposed between the substrate and said channel layer.

4. A photo-detector as claimed in claim 1, wherein the substrate is of InP, the first layer is of n-type GaInAs and the second layer is of n-type InP or AlInAs.

5. A photo-detector as claimed in claim 4, wherein the photodetector includes a layer of p-type InP disposed between the substrate and the channel layer.

6. A photo-detector as claimed in claim 1, wherein the substrate is of GaAs, the first layer is of n-type GaAs and the second layer is of n-type AlGaAs.

7. A photo-detector as claimed in claim 6, wherein the photoconductor includes a layer of p-type AlGaAs disposed between the substrate and the channel layer.

8. A photo-detector as claimed in claim 1, wherein the bias resistor is monolithically integrated with the photo-detector and the high electron mobility transistor.

* * * * *